United States Patent
Vaupel et al.

(10) Patent No.: US 8,883,565 B2
(45) Date of Patent: Nov. 11, 2014

(54) SEPARATION OF SEMICONDUCTOR DEVICES FROM A WAFER CARRIER

(75) Inventors: Mathias Vaupel, Regensburg (DE); Sebastian Bernrieder, Regensburg (DE); Adolf Koller, Regensburg (DE); Stefan Martens, Munich (DE)

(73) Assignee: Infineon Technologies AG, Neubiberg (DE)

( * ) Notice: Subject to any disclaimer, the term of this patent is extended or adjusted under 35 U.S.C. 154(b) by 214 days.

(21) Appl. No.: 13/252,816

(22) Filed: Oct. 4, 2011

(65) Prior Publication Data

US 2013/0084658 A1 Apr. 4, 2013

(51) Int. Cl.
| | |
|---|---|
| H01L 21/00 | (2006.01) |
| H01L 21/78 | (2006.01) |
| H01L 21/683 | (2006.01) |
| H01L 21/67 | (2006.01) |
| H01L 21/50 | (2006.01) |
| H01L 21/56 | (2006.01) |
| H01L 23/31 | (2006.01) |

(52) U.S. Cl.
CPC ......... H01L 21/78 (2013.01); *H01L 2924/0002* (2013.01); *H01L 21/565* (2013.01); H01L 21/683 (2013.01); H01L 21/67 (2013.01); *H01L 21/561* (2013.01); H01L 21/50 (2013.01); *H01L 21/568* (2013.01); *H01L 23/3107* (2013.01)
USPC ............... 438/113; 438/33; 438/68; 438/107; 257/527; 257/594

(58) Field of Classification Search
CPC ..................................................... H01L 21/784
USPC ........................................................ 438/113
See application file for complete search history.

(56) References Cited

U.S. PATENT DOCUMENTS

| | | | |
|---|---|---|---|
| 3,757,367 A | | 9/1973 | Campbell |
| 3,781,609 A | * | 12/1973 | Baker et al. ................... 257/786 |
| 5,062,898 A | | 11/1991 | McDermott et al. |
| 5,539,325 A | | 7/1996 | Rostoker et al. |
| 5,766,061 A | | 6/1998 | Bowers |
| 5,775,127 A | | 7/1998 | Zito |
| 5,853,962 A | | 12/1998 | Bowers |
| 5,908,510 A | | 6/1999 | McCullough et al. |
| 5,931,721 A | | 8/1999 | Rose et al. |
| 6,036,581 A | | 3/2000 | Aoki |

(Continued)

OTHER PUBLICATIONS

Busnaina, A.A., et al., "The Removal of Submicron Particles Using CO2 Aerosol with Emphasis on Post-CMP Applications," 3 pages, Microcontamination Research Laboratory Northeastern University, Boston, MA.

(Continued)

*Primary Examiner* — Ajay K Arora
(74) *Attorney, Agent, or Firm* — Slater & Matsil, L.L.P.

(57) ABSTRACT

In accordance with an embodiment of the present invention, a semiconductor device is manufactured by arranging a plurality of semiconductor devices on a frame with an adhesive foil. The plurality of semiconductor devices is attached to the adhesive foil. The plurality of semiconductor devices is removed from the frame with the adhesive foil using a carbon dioxide snow jet and/or a laser process.

32 Claims, 11 Drawing Sheets

(56) References Cited

U.S. PATENT DOCUMENTS

| | | | |
|---|---|---|---|
| 6,066,032 | A | 5/2000 | Borden et al. |
| 6,203,406 | B1 | 3/2001 | Rose et al. |
| 6,332,470 | B1 | 12/2001 | Fishkin et al. |
| 6,972,202 | B2 | 12/2005 | Nishihashi et al. |
| 7,135,384 | B2 | 11/2006 | Takyu et al. |
| 2001/0016257 | A1* | 8/2001 | Bennett et al. ............ 428/355 R |
| 2001/0043076 | A1 | 11/2001 | Itasaka et al. |
| 2002/0030040 | A1 | 3/2002 | Farnworth |
| 2003/0119424 | A1* | 6/2003 | Ahmadi et al. .................. 451/39 |
| 2003/0160315 | A1* | 8/2003 | Kovar et al. .................... 257/685 |
| 2003/0188763 | A1* | 10/2003 | Banerjee et al. ............... 134/1.2 |
| 2004/0232524 | A1 | 11/2004 | Howard et al. |
| 2005/0146013 | A1 | 7/2005 | Farnworth et al. |
| 2005/0157762 | A1* | 7/2005 | DeMaria et al. .................. 372/9 |
| 2005/0287952 | A1 | 12/2005 | Ryan et al. |
| 2006/0286768 | A1* | 12/2006 | Arana et al. .................. 438/455 |
| 2007/0296077 | A1* | 12/2007 | Moline ......................... 257/712 |
| 2008/0213978 | A1 | 9/2008 | Henry et al. |
| 2011/0193200 | A1 | 8/2011 | Lyne et al. |

OTHER PUBLICATIONS

Sherman, R., et al., "Surface Cleaning with the Carbon Dioxide Snow Jet," Journal of Vacuum Science and Technology A, American Vacuum Society, vol. 12, Issue 4, Jul./Aug. 1994, pp. 1876-1881.

Tourdot, J.M., "A Comparison of Wet Manual Cleaning Processes to Carbon Dioxide Cleaning Processes in the Semiconductor Industry," A Research Paper Submitted in Partial Fulfillment of the Requirements for the Masters of Science Degree in Risk Control, May 2001, 35 pages, University of Wisconsin Stout.

"Carbon Dioxide Cleaning: Going Through Phases," A Panel Discussion of Co2Cleaning Technology, International Cleaning Technology Exposition, CleanTech'99, Jul./Aug. 1999, 1 cover page, pp. 27-34.

Mariani, F., et al., "Current Challenges in Preassembly: The Focus Changes from Thinning to Singulation," KGD Packaging & Test Workshop, Napa, California, Sep. 9-12, 2007, 29 pages.

\* cited by examiner

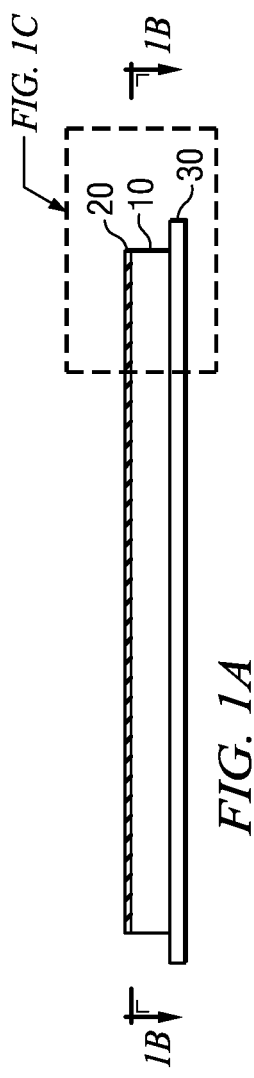
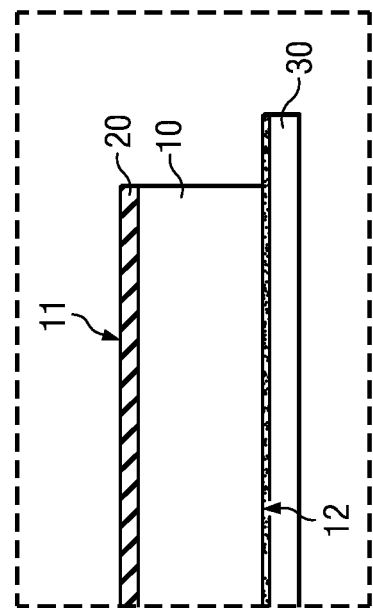
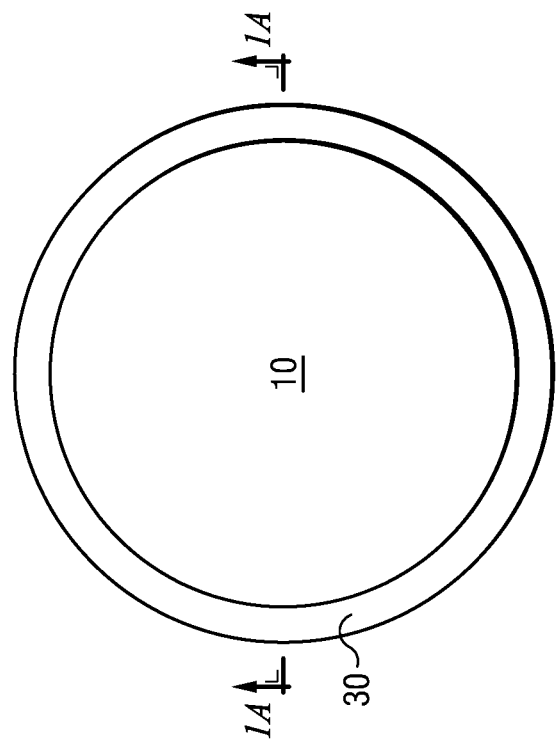

SEPARATION OF SEMICONDUCTOR DEVICES FROM A WAFER CARRIER

TECHNICAL FIELD

The present invention relates generally to a method, and more particularly to a method for separation of semiconductor devices from a wafer carrier.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically and/or chemically treated and the semiconductor devices are physically separated to form individual dies. The separated dies may still be attached to a frame with an adhesive foil used to hold the wafer for the singulation process. The separated dies are individually picked from the wafer frame, tested and the good (not defective) units are placed into a carrier tape (or other suitable substrate) during packaging. However, such a process is time consuming and may become the bottleneck for the overall production.

SUMMARY OF THE INVENTION

These and other problems are generally solved or circumvented, and technical advantages are generally achieved, by illustrative embodiments of the present invention.

In accordance with an embodiment of the present invention, a method of manufacturing a semiconductor device comprises arranging a plurality of semiconductor devices on a frame with an adhesive foil. The plurality of semiconductor devices is attached to the adhesive foil. The plurality of semiconductor devices is removed from the frame with the adhesive foil using a carbon dioxide snow jet.

In accordance with an alternative embodiment of the present invention, a method of manufacturing a semiconductor device includes providing a wafer comprising a plurality of dies and testing the plurality of dies to identify first dies of the plurality of dies. The first dies are identified to be separated from remaining dies of the plurality of dies. The wafer is singulated into the plurality of dies and a frame with an adhesive foil is attached to the plurality of dies for carrying the plurality of dies. Using a laser process, the first dies are detached from the frame with the adhesive foil without removing the remaining dies of the plurality of dies.

In one or more embodiments, a laser process may also be used for removing the good dies. In various embodiments, a laser process may also be used to remove all dies and the rejects may be sorted in a later process.

In accordance with yet another embodiment of the present invention, a method of manufacturing a semiconductor device includes providing a wafer comprising a plurality of dies and identifying defective dies from the plurality of dies. The wafer is singulated into the plurality of dies. A frame with an adhesive foil is attached to the plurality of dies by a relamination process so that the frame with the adhesive foil holds the plurality of dies. The defective dies are removed from the frame with the adhesive foil. The remaining dies of the plurality of dies are removed from the frame with the adhesive foil using a carbon dioxide snow jet. The removed dies are transferred to a bowlfeeder handler and are arranged into a carrier tape.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 12, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for rapidly removing semiconductor dies attached to a wafer frame (a frame with an adhesive foil) or carrier will be described using FIGS. 1-10, 17-18, 19-21 in accordance with embodiments of the invention. A carbon dioxide snow jet as used by embodiments of the invention will be described using FIG. 11. An embodiment for removing, e.g., defective dies from a frame with an adhesive foil will be described using FIG. 12. An embodiment of the invention will be described for removal of packaged semiconductor dies will be described using FIG. 13-16.

FIGS. 1-11 illustrates a method of fabricating a semiconductor device during various stages of processing in accordance with embodiments of the invention.

Figure 1D:
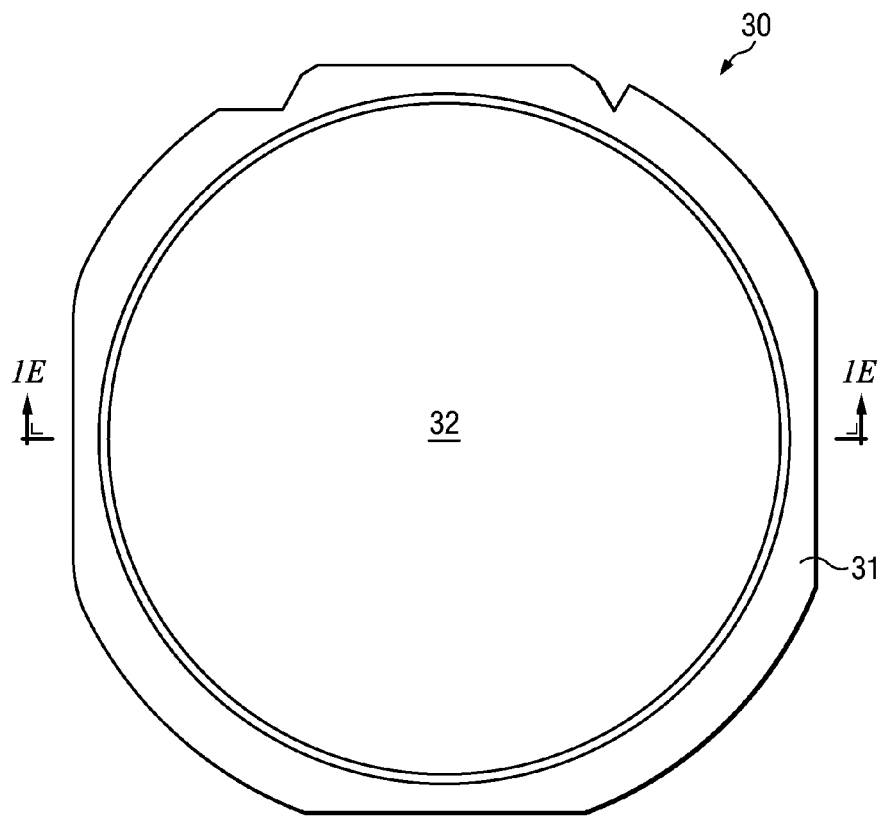
FIGS. 1-10 illustrates a semiconductor device in various stages of processing in accordance with a method of fabricating the semiconductor device using a carbon dioxide snow jet in accordance with embodiments of the invention.
Figure 1E:
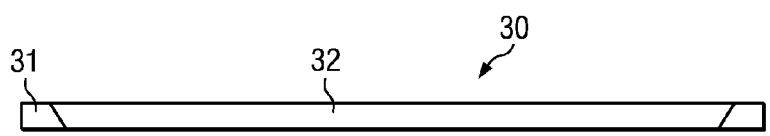

FIG. 1, which includes FIGS. 1A-1E, illustrates a semiconductor wafer during one stage of fabrication process, wherein FIG. 1A illustrates a cross-sectional view of the wafer and FIG. 1C is the magnified cross-sectional view, FIG. 1B illustrates a top view, wherein FIG. 1D illustrates a top view of a carrier, and FIG. 1E illustrates a cross sectional view of the carrier 30 illustrating a frame and an adhesive foil.

Referring to FIG. 1, a substrate 10 is illustrated after the formation of active regions of the device. The active regions may comprise a discrete device such as a diode or a transistor in one embodiment. In other embodiments, the active regions may comprise a plurality of transistors and/or diodes forming an integrated circuit. In one embodiment, the substrate 10 may comprise a semiconductor wafer such as a silicon wafer. In other embodiments, the substrate 10 may comprise other semiconductor materials including alloys such as SiGe, SiC or compound semiconductor materials such as GaAs, InP, InAs, GaN, sapphire, silicon on insulation, for example.

The substrate 10 comprises a top surface 11 and an opposite bottom surface 12. In various embodiments, the active devices are formed closer to the top surface 11 of the substrate 10 than the bottom surface 12.

The substrate 10 may include a protective layer 20 during further processing. The protective layer 20 may comprise an oxide, nitride, polyimide, or other suitable materials known to one skilled in the art. The protective layer 20 helps to protect the active region during subsequent processing. The individual dies that are being formed within the wafer may be tested for functionality. For example, in one embodiment, each die may be tested. Dies that do not pass a certain predetermined test may be marked as being defective. Defective dies may be marginal with respect to a desired parametric and may operate at a reduced performance. Alternatively, the defect may render the die entirely unusable. Typically, defective dies (e.g., unusable dies) account for about a few percent or less of the total dies on the substrate 10. At this stage of the fabrication process, the location of the defective dies may be marked so that they may be removed in subsequent steps.

During processing, the wafer is placed on a carrier 30. In one or more embodiments, the wafer is placed on the carrier 30 after the testing. The carrier 30 comprises a frame 31, which is an annular structure (ring shaped) with an adhesive foil 32. The adhesive foil 32 is supported along the outer edges by the frame 31 in one or more embodiments. In alternative embodiments, the frame 31 may comprise other suitable shapes. FIG. 1D illustrates a top view of the carrier 30 and FIG. 1E illustrates a cross sectional view of the carrier 30 illustrating the frame 31 and the adhesive foil 32.

Figure 2:
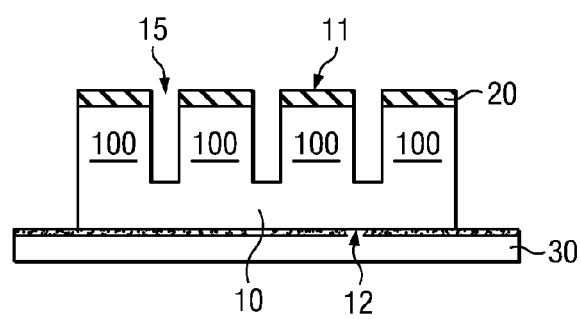

Next, as illustrated in FIG. 2, the substrate 10 is diced by physically separating the devices adjacent the top surface 11 of the substrate 10. In one or more embodiments, the substrate 10 is diced, for example, using a mechanical saw. In other embodiments, the dicing may be performed using an etch process or a combination of an etch process and a mechanical process. Embodiments of the invention also include use of irradiation processes such as lasers to (partially) dice the wafers. In one or more embodiments, the dicing saw cuts through the substrate 10 along dicing channels 15. The dicing channels 15 separate the individual dies 100 on the substrate 10. In various embodiments, the dicing process is stopped after a portion of the substrate 10 is diced leaving an un-diced portion of the substrate 10. In various embodiments, the depth of the dicing channel is about 5 µm to about 500 µm, and about 200 µm in one embodiment.

In alternative embodiments, the testing process may be performed after the dicing process illustrated in FIG. 2.

Figure 3:
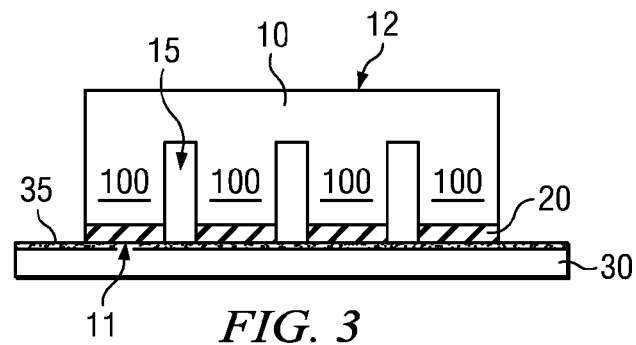

Next, as illustrated in FIG. 3, the substrate 10 is removed from the adhesive foil 32 of the carrier 30. The top surface 11 of the substrate 10 is attached to a tape layer 35. The tape layer 35 is placed on a carrier 30, which may be the same or different from the carrier 30 in FIG. 2, exposing the bottom surface 12 of the substrate 10 for further processing. In other embodiments, other suitable process may be used to hold the substrate 10 during the subsequent grinding process.

Figure 4:
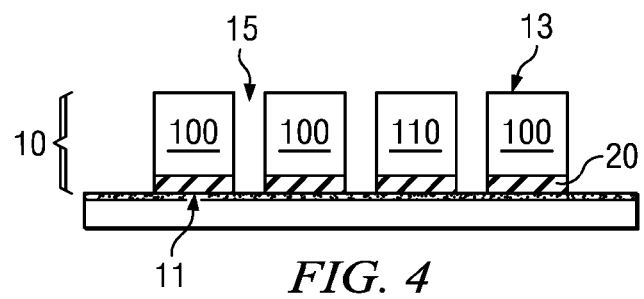

As next illustrated in FIG. 4, the bottom surface 12 (FIG. 3) is exposed to a grinding process that thins the substrate 10 exposing a lower surface 13. The grinding separates the substrate 10 into separate dies 100 thereby completing the singulation of the substrate 10 into dies 100.

Figure 5:
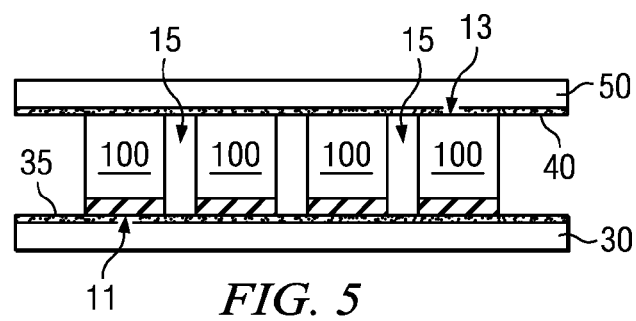

Referring to FIG. 5, before removing the tape layer 35 from the top surface 11, a wafer frame 50 with an adhesive layer 40 is attached to the exposed lower surface 13 of the dies 100 in a relamination process to hold the separated dies in position. In some embodiments, the process of attaching the dies 100 to the adhesive layer 40 and the wafer frame 50 may be skipped and instead the process follows FIG. 6 wherein the dies are removed from the tape layer 35 using embodiments of the invention. The dies 100 may be attached to the wafer frame 50 using an adhesive layer 40 in one embodiment. After attaching the wafer frame 50 with the adhesive layer 40, the tape layer 35 over the top surface 11 may be removed. Alternatively, in some embodiments, the wafer frame 50 may be attached before singulation. In such embodiments, a grinding process first thins the substrate 10 exposing the lower surface 13. Next, the exposed lower surface 13 may be attached to the wafer frame 50 with an adhesive layer 40 and singulation is completed from the top surface 11.

Figure 6A:
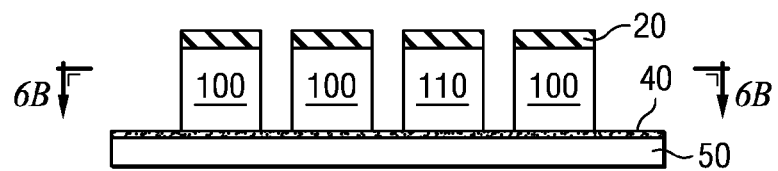
Figure 6B:
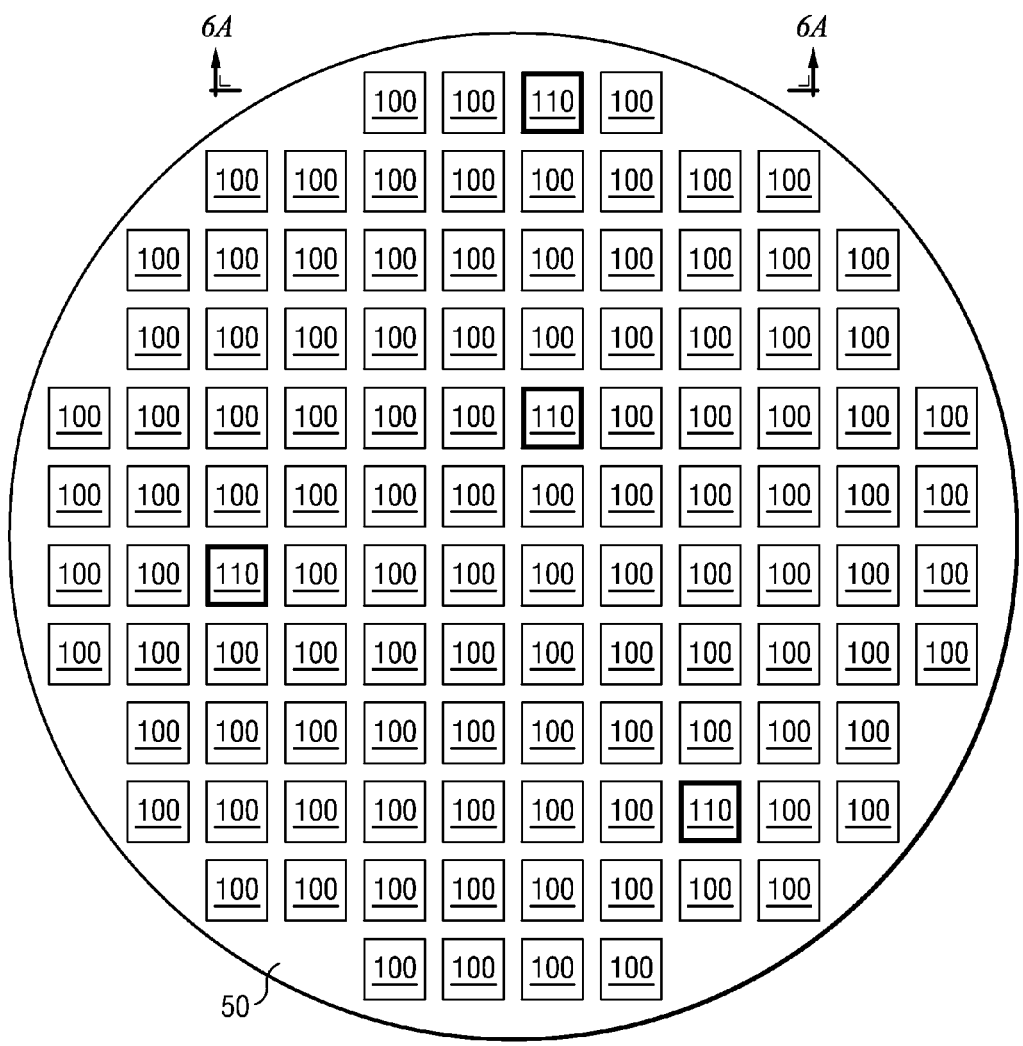
Figure 6C:
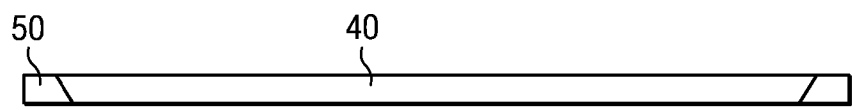
Figure 6D:
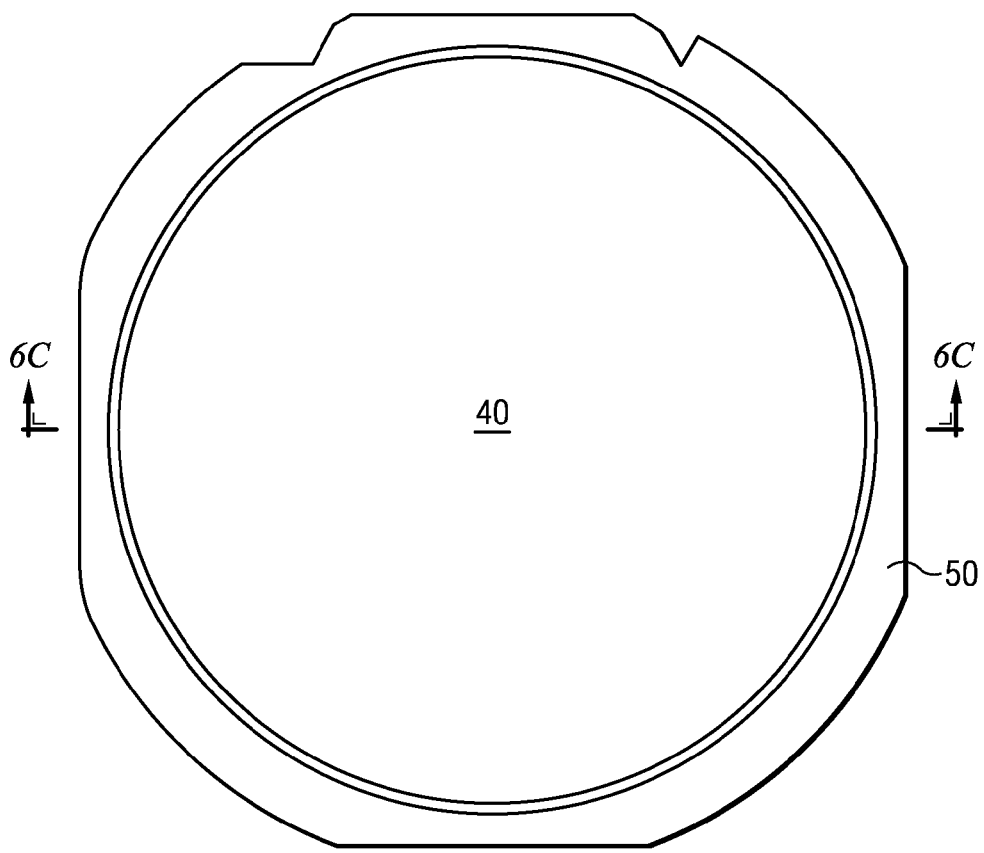

FIG. 6, which includes FIGS. 6A-6D, illustrates the dies 100 formed after singulation. FIG. 6A illustrates a cross-sectional view while FIG. 6B illustrates a top view. Further, FIG. 6C illustrates a top view of a frame with an adhesive layer, and FIG. 6D illustrates a cross sectional view illustrating a frame with an adhesive layer.

The dies 100, which include both good dies and defective dies 110, remain attached to the wafer frame 50 with the adhesive layer 40. The wafer frame 50 has an annular shape (ring shaped). An adhesive layer 40, which is a foil with an adhesive, is attached to the wafer frame 50 so as to support the dies 100. The adhesive layer 40 is supported along the outer edges by the wafer frame 50 as illustrated in FIGS. 6C and 6D in one or more embodiments.

Referring to FIG. 6A, the substrate 10 is reversed exposing the protective layer 20 at the top surface 11 of the substrate 10. The separated dies 100 and defective dies 110 (as identified previously) have been attached to the wafer frame 50 with the adhesive layer 40 as described above. A typical wafer may yield many thousands of dies, e.g., 10,000 to 500,000, depending on the die size and the wafer size, although for illustration only a small number of dies are illustrated in the schematic of FIG. 6B.

As described above, the dies 100 may be tested to identify defective dies 110 that are to be discarded. If the testing has not yet been performed, testing is completed to determine the location of any such defective dies 110. In some embodiments, testing might also be performed after removal of all the dies.

Figure 7:
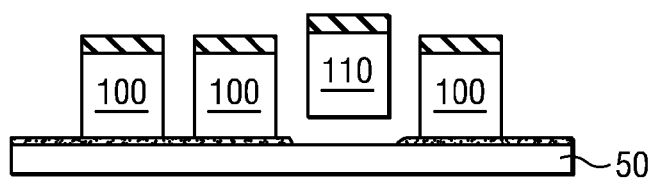

Referring to FIG. 7, the defective dies 110 are removed from the wafer frame 50 with adhesive layer 40, for example, by detaching the defective dies 110 using mechanical force. Only good (functional) dies 100 remain on the wafer frame 50 with adhesive layer 40 after the defective dies 110 are removed. An embodiment of the removal of the defective dies 110 will be provided with respect to FIG. 12.

In various embodiments, the adhesive layer 40 may be subjected to a specific treatment to reduce the adhesion force of the adhesive layer 40 to the dies 100. As examples, electromagnetic irradiation may be performed, for example, a UV treatment may be performed in one embodiment.

Figure 8A:
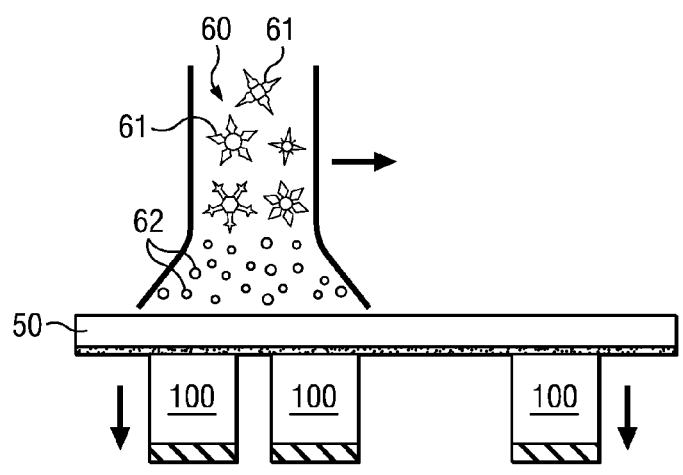
Figure 8B:
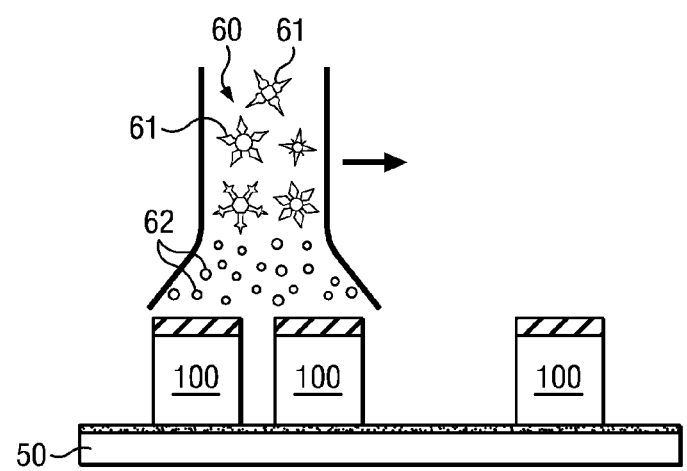

FIG. 8, which includes FIGS. 8A and 8B, illustrates embodiments of removing the good dies from the wafer frame.

In various embodiments, the good dies 100 may be removed using a carbon dioxide snow ($CO_2$ snow 60). In various embodiments, the $CO_2$ snow 60 may be applied either from the back surface (FIG. 8A) or from the front surface (FIG. 8B). This is because the $CO_2$ snow 60 is inert and does not add contaminants. Therefore, exposing the active surface to the $CO_2$ snow 60 does not deteriorate or impact the active devices adjacent the active surface. Alternatively in some embodiments, all dies are removed from the wafer and sorted in bulk form or during taping.

Referring to FIG. 8A, in one or more embodiments, the carbon dioxide snow ($CO_2$ snow 60) may be applied to the back surface. In various embodiments, the $CO_2$ snow 60 comprises a high super cooled jet of $CO_2$. In various embodiments, the $CO_2$ snow 60 includes a mixture of snow flakes 61 and ice particles 62. The $CO_2$ snow 60 process is described below using FIG. 11. The rapid decrease in temperature coupled with a vibration of the wafer frame 50 and the adhesive layer 40 separates the wafer frame 50 and/or the adhesive layer 40 from the dies 100. For example, the coefficient of thermal expansion between the wafer frame 50/adhesive layer 40 and the dies 100 may delaminate the dies 100 from the wafer frame 50 with the adhesive layer 40 when they are subject to the $CO_2$ snow 60. Further, the $CO_2$ snow 60 may have a chemical effect and may behave like a solvent and therefore may dissolve part of the adhesive layer 40. Consequently, the dies 100 are separated from the wafer frame 50 with the adhesive layer 40 in a single rapid step and collected or transferred into a bowl 70.

As illustrated in an alternative embodiment in FIG. 8B, the $CO_2$ snow 60 may be applied to the front surface of the wafer frame 50 with the adhesive layer 40 holding the dies 100. The rapid decrease in temperature coupled with the impact of the high velocity jet, which includes ice particles 62 results in fracture of the adhesive between the wafer frame 50 with the adhesive layer 40 and the dies 100.

Advantageously, unlike solvents such as water, which leave spots on the dies 100, the $CO_2$ snow 60 does not leave any trace or spots on the dies 100. Unlike compressed nitrogen, the $CO_2$ snow 60 may be applied at a lower pressure. The use of lower pressure avoids the risk of dislodging any die and thereby damaging the die. For example, the $CO_2$ snow 60 may be provided at a pressure of about 1 bar to about 10 bars. Further, advantageously, unlike other chemical solvents, the $CO_2$ snow 60 is not toxic and environmentally friendly.

Advantageously, using the $CO_2$ snow 60 process, the dies 100 can be removed much faster than other conventional processes. For example, a wafer having about 250,000 devices may be processed in less than about 15 minutes whereas conventional processes require more than an hour to remove the same number of dies 100 from the wafer frame 50 with the adhesive layer 40. In various embodiments, the dies 100 are removed in about 1 minute to about 20 minutes from a wafer frame 50 with the adhesive layer 40 designed for 200 mm wafers. In one embodiment, the time required may be between 5 minutes to about 10 minutes per wafer frame 50.

Figure 9:
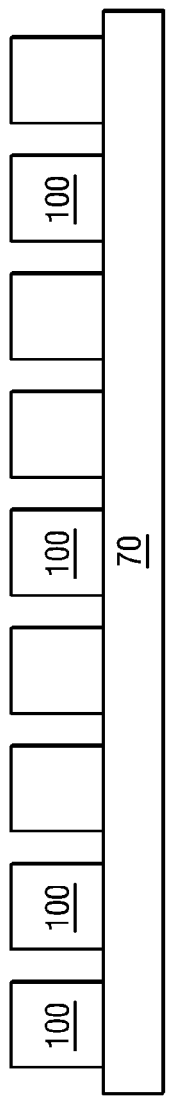
Figure 10:
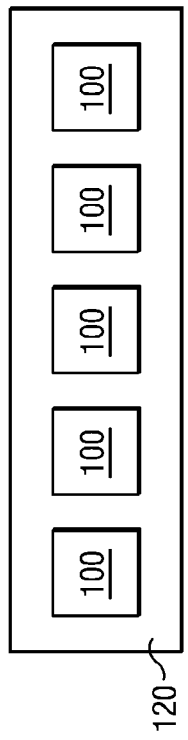

Referring next to FIG. 9, the dies 100, after being separated from the wafer frame 50 with the adhesive layer 40 are collected in a bowl 70 or other suitable means (such as a transfer belt). Subsequent processing continues as in conventional semiconductor processing. For example, the dies 100 are fed into a bowlfeeder handler. The bowlfeeder handler may perform further tests (typically basic functionality tests) and may attach the dies 100 on to a tape 120 sequentially (FIG. 10).

Figure 11:
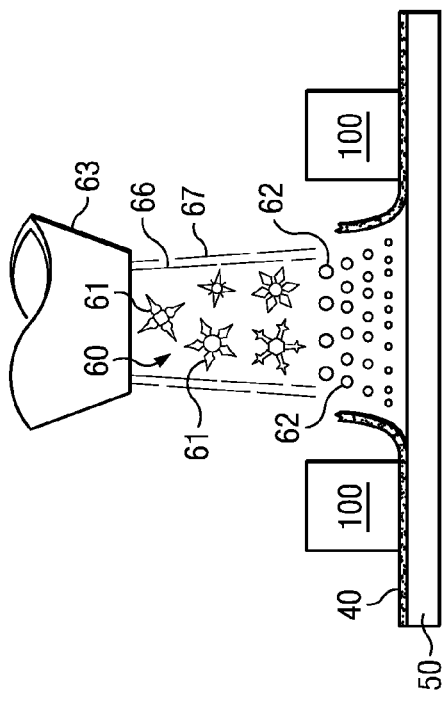
FIG. 11 illustrates a carbon dioxide snow jet process in accordance with embodiments of the invention.

FIG. 11 illustrates a carbon dioxide snow jet process in accordance with embodiments of the invention.

Referring to FIG. 11, a nozzle 63 directs a $CO_2$ snow 60 towards the wafer frame 50 comprising the adhesive layer 40. The nozzle 63 releases a jet of carbon dioxide, which forms the $CO_2$ snow 60. The jet of carbon dioxide is super-critical, i.e., cooled below the freezing point. Therefore, upon release from the nozzle 63, the gas quickly forms snow flakes 61. In various embodiments, the nozzle 63 may comprise a supersonic nozzle. In other words, the nozzle is designed to release the jet of carbon dioxide at speeds above the sonic velocity (about 330 m/s at 0° C.).

In various embodiments, the jet of carbon dioxide is released at about 250 m/s to about 700 m/s, and about 500 m/s in one embodiment. The nozzle 63 may be a convergent-divergent nozzle in one embodiment. In one embodiment of a convergent-divergent nozzle, the convergent portion accelerates the gas to sonic velocity and the divergent portion accelerates the gas further beyond sonic velocity.

Referring again to FIG. 11, as the $CO_2$ snow 60 travels further from the nozzle 63, the snow flakes 61 undergo particle coarsening, agglomeration, sublimation etc. and may form ice particles 62. The size of the ice particles 62 may reduce as the $CO_2$ snow 60 moves further from the nozzle 63. Thus, ice particles 62 traveling at high velocity impinge on the wafer frame 50 (or adhesive layer 40) in one embodiment. In an alternative embodiment, a mixture of ice particles 62 and snow flakes 61 impinge on the wafer frame 50 with the adhesive layer 40.

The $CO_2$ snow 60 may separate the good dies 100 from the wafer frame 50 with the adhesive layer 40 due to multiple effects. For example, as described above, the $CO_2$ snow 60 may undergo a phase transformation from snow flakes 61 to ice particles 62. The ice particles 62 traveling at high velocity may remove the adhesive layer 40 upon impact by mechanical action. Further, the ice particles 62 may reduce the temperature of the wafer frame 50 and the adhesive layer 40. The temperature of the $CO_2$ at the time of impact with the surface of the adhesive layer 40 or dies 100 is about −20° C. to about −30° C. If the temperature becomes too low, the risk of damaging the dies due to thermal shock increases. In one or more embodiments, the temperature of the $CO_2$ snow 60 is about −60° C. to about −100° C., and about −80° C. in one embodiment. In one or more embodiments, the temperature of the surface of the adhesive layer 40 is about 0° C. to about −20° C., and about −10° C. in one embodiment. The ice particles 62 may also transform into the gas phase (sublime). As a consequence of these processes, the adhesive layer 40 may become brittle and rupture.

The $CO_2$ snow 60 may also behave as a solvent and dissolve a portion of the adhesive layer 40 because of the formation of supercritical liquid carbon dioxide. Supercritical liquid may be obtained by maintaining the pressure and temperature of the $CO_2$ snow 60 in the supercritical regime, e.g., above 31° C. and 72.8 atm. The supercritical fluid advantageously has an extremely low viscosity (low surface tension) and superior solvent properties than the liquid phase. In some embodiments, a purely liquid phase carbon dioxide may be used.

In some embodiments, the $CO_2$ snow 60 may be adjusted to be primarily a snow type jet. Such embodiments utilize the liquid solvent effect in combination with the thermo-mechanical effect as described with respect to the ice particles 62 in removing the adhesive layer 40. The relative ratio of the snow flakes 61, ice particles 62, gaseous carbon dioxide, and liquid carbon dioxide may be adjusted as is known to one skilled in the art. Advantageously, the $CO_2$ snow 60 does not leave any residues on the dies 100.

In various embodiments, the $CO_2$ snow 60 comprises an inner jet 66 and an outer jet 67 surrounding the inner jet 66. The outer jet 67 may comprise purified compressed air or nitrogen in various embodiments. The inner jet 66 may comprise one or more phases of carbon dioxide e.g., snow and/or gas.

Figure 12A:
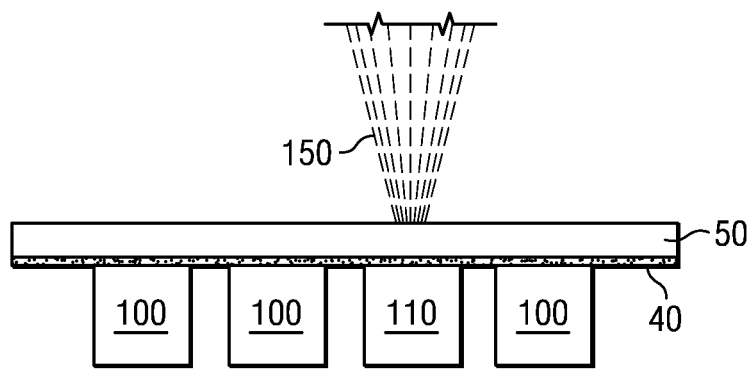
FIGS. 12A and 12B, illustrates an alternative embodiment of the invention for removing defective dies using a laser process.
Figure 12B:
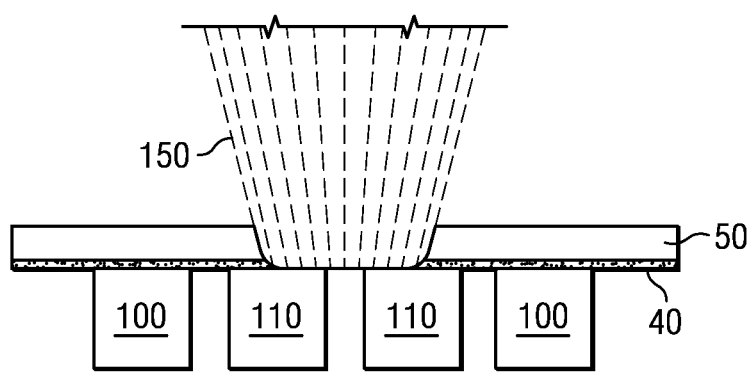

FIG. 12, which includes FIGS. 12A and 12B, illustrates an alternative embodiment of the invention for removing defective dies using a laser process.

Although described below for the removal of defective dies, in various embodiments, the laser process may also be used to remove all dies or the good dies.

FIG. 12 illustrates an embodiment of the invention for removing defective dies 110 as described earlier with respect to FIG. 7. Processing follows the embodiment described with respect to FIGS. 1-6 and defective dies 110 are identified. In FIG. 12, the defective dies are removed using a laser process.

Referring to FIG. 12A, a local laser process may be used in one embodiment to remove defective dies 110 from the wafer frame 50 with an adhesive layer 40. The wafer frame 50 and the adhesive layer 40 may be formed as described above with respect to FIG. 6. The laser process uses a laser beam 150 that is smaller than the size of the dies 100. Therefore, the laser beam 150 heats only a portion of the wafer frame 50 with the adhesive layer 40 over the defective dies 110. The local heating of the wafer frame 50 with the adhesive layer 40 results in the expansion of the wafer frame 50 with the adhesive layer 40 and causes a local sublimation of the adhesive between the adhesive layer 40 and the defective dies 100. The removal of the adhesive attaching the defective dies 110 to the adhesive layer 40 releases the defective dies 110. The focused beam of the laser beam 150 ensures that only the defective dies 110 are removed because the adhesive layer 40 is heated locally.

Advantageously, the focused laser beam 150 does not have to be exactly positioned as long as it is positioned over the defective dies 110. The laser power must be controlled to minimize any impact to the adjacent dies 100. The speed of the laser beam must be maintained at a fast pace to cover the whole wafer surface without compromising on the need for additional processing time. Therefore, the synchronization between the stepping motor and the laser beam 150 may require adjustments and continual monitoring.

In various embodiments, the laser source may comprise $CO_2$, solid state lasers such as yttrium aluminum garnet (YAG) lasers, semiconductor lasers, etc. In various embodiments, the laser source may comprise any suitable laser device and may include a Galvo Head in one embodiment. The beam diameter of the laser beam 150 at the surface of the wafer frame 50 with the adhesive layer 40 may be about 10 µm to about 100 µm, and about 30 µm in one embodiment. The wavelength of the laser may be 532 nm or other suitable wavelengths may be used in other embodiments. In one embodiment, the laser may be operated at about 5 kHz to about 20 kHz, and about 10 kHz in one embodiment. The laser may be operated at about 10 A to about 40 A, and about 24 A in one embodiment. The laser beam 150 may be scanned at about 100 mm/s to about 1000 mm/s, and about 200 mm/s in one embodiment. The laser beam 150 may be focused on a plane about 1 mm to about 10 mm above the surface of the wafer frame 50 with the adhesive layer 40 (or object being exposed), and about 4 mm above in one embodiment.

FIG. 12B illustrates an alternative embodiment for removing a large number of defective dies simultaneously. Unlike the prior embodiment, in this embodiment, a laser beam 150 having a large beam diameter is used. For example, the beam diameter of the laser beam 150 may be larger than a single die. In any case, the width of the laser beam is large enough to simultaneously remove a plurality of dies in this embodiment. For example, about 5 dies to about 100 dies may be simultaneously removed in a single exposure of the laser beam 150.

In some embodiments, the beam diameter of the laser beam 150 may be twice or more than the width of an average die being fabricated. For example, in one embodiment, the defective dies 110 and the next adjacent dies 100 may be removed. This may be done as the adjacent dies 100 although passing the functionality test may also be prone to be defective and/or may have lower performance.

Advantageously, in this embodiment, a lower laser power intensity relative to the embodiment described in FIG. 12A may be used. Therefore, adjacent good dies 100 will not be damaged during the laser removal of the defective dies 110. Further, because of the bulk removal process, the speed of removal can be slower without compromising the production yield (due to an increase in processing time). Therefore, the synchronization of the laser beam with the stepping motor will be easier.

In various embodiments, the laser source described in FIG. 12B may comprise $CO_2$, solid state lasers such as yttrium aluminum garnet (YAG) lasers, semiconductor lasers, etc. Further, the laser source may comprise any suitable laser device and may not include a Galvo Head in one embodiment. The beam diameter of the laser beam 150 at the surface of the wafer frame 50 with the adhesive layer 40 (FIG. 12B) may be about 100 µm to about 10 mm, and about 5 mm in one embodiment. The wavelength of the laser may be 1064 nm or 532 nm, or other suitable wavelengths may be used in other embodiments. In an alternative embodiment, a carbon dioxide snow process may be used to remove defective dies as well. The carbon dioxide snow process (as described above) may be used when a large fraction of the dies are defective.

Although not illustrated, the embodiments described using FIGS. 1-11 may be combined together with the embodiments described with respect to FIG. 12 in various embodiments.

FIGS. 13-16 illustrate an embodiment of the invention for fabricating semiconductor packages using a carbon dioxide snow jet or laser process in accordance with embodiments of the invention.

Although described above for wafer scale processing, embodiments of the invention may also be applied to semiconductor dies during packaging. For example, embodiments of the invention may be applied during packaging for removal of the packages from a frame with an adhesive foil using a $CO_2$ snow jet process or a laser process. An illustrative embodiment is described using FIGS. 13-16.

Figure 13A:
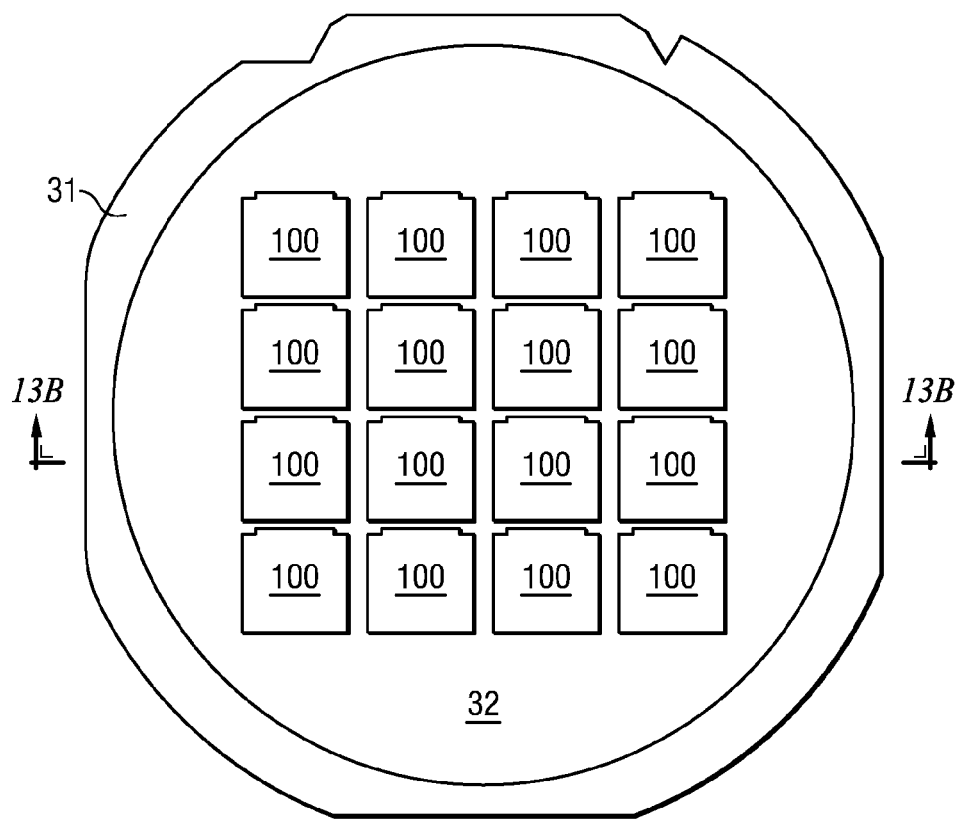
FIGS. 13-16 illustrates a semiconductor device in various stages of processing in accordance with a method of fabricating the semiconductor package using a carbon dioxide snow jet or laser process in accordance with embodiments of the invention.
Figure 13B:
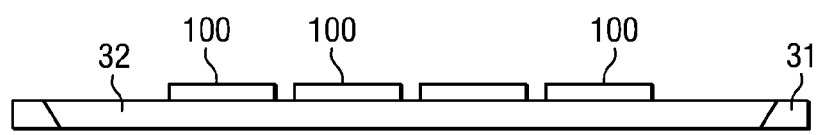

FIG. 13, which includes FIGS. 13A and 13B, illustrates a frame 31 with an adhesive foil 32 supporting a plurality of dies 100. The plurality of dies 100 may be arranged as an array over the adhesive foil 32. Packaging processes may be performed with the plurality of dies 100, for example, the die may be bonded to contact pads using a bump process. Alternatively, the plurality of dies 100 may be arranged and attached to the adhesive foil 32 after the bump process as will be described further below using FIG. 15.

Figure 14:
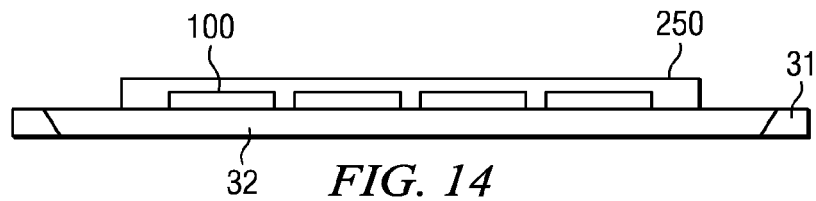

Next, as illustrated in FIG. 14, the plurality of dies 100 may be covered with a mold compound 250 during a molding process. The molding process may include a curing step after which the dies 100 are encapsulated with the mold compound 250. A laser marking process may be used to mark the packages.

Figure 15A:
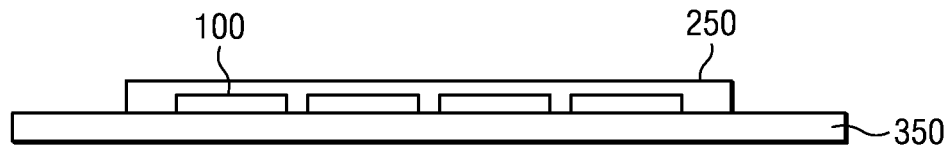
Figure 15B:
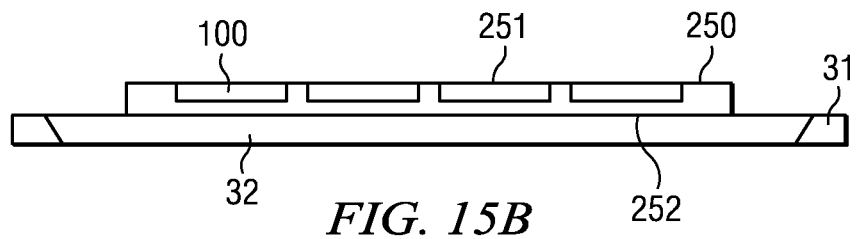

In some embodiments, the plastic package is attached to the adhesive foil 32 after the completion of the molding process. For example, as illustrated in the alternative embodiment of FIG. 15A, prior to molding, the plurality of dies are placed over a leadframe 350. After molding and optionally laser marking, the leadframe 350 is removed, for example, by etching (FIG. 15B). An optional electroplating may be performed to reduce contact resistance of the contact 251. The plastic package is then arranged over a frame 31 with an adhesive foil 32 as illustrated in FIG. 15B. As illustrated in FIG. 15B, the side 252 opposite the contact 251 may be placed on the adhesive foil 32 in one embodiment.

Figure 16:
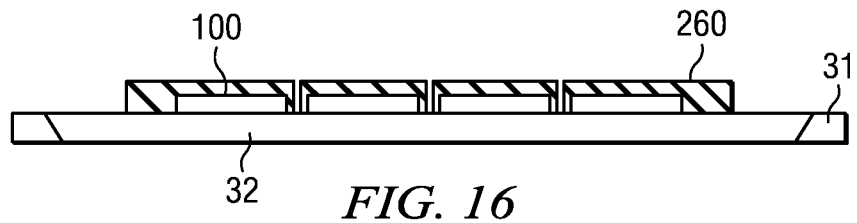

As next illustrated in FIG. 16, a dicing process is performed separating the molding compound 250 and thereby forming a plurality of packages 260. The dicing process may be performed mechanically using a dicing saw in one embodiment. Thus, a plurality of packages 260 attached to the adhesive foil 32 is formed. The plurality of packages 260 may be separated from the adhesive foil 32 to form bulk material using the $CO_2$ snow jet process described using FIGS. 1-11 and/or the laser process described using FIG. 12. The separated packages may be tested and are packed into a tape and reel.

Figure 17:
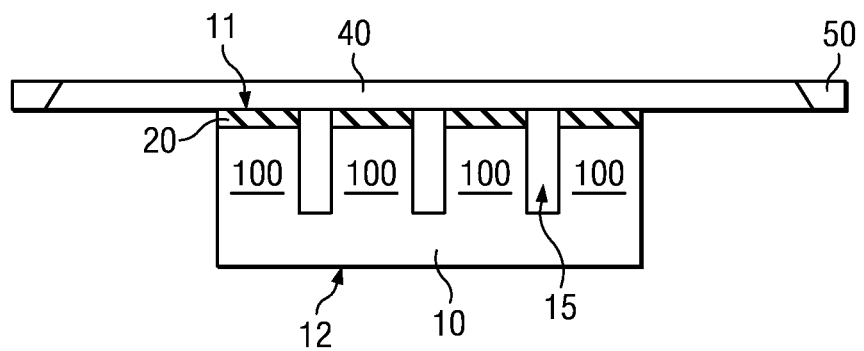
FIGS. 17-18 illustrate an alternative embodiment of the manufacturing of a semiconductor device.
Figure 18:
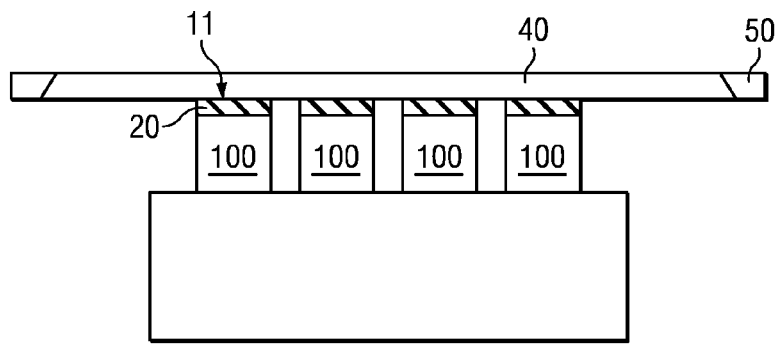

FIGS. 17-18 illustrate an alternative embodiment of the manufacturing of a semiconductor device.

Device regions and interconnect circuitry are formed on a substrate 10 (e.g., wafer) as in conventional processing. The wafer is tested to identify good and/or defective dies. As illustrated in FIG. 1, the substrate 10 comprising the plurality of dies being formed is attached to a carrier 30. The substrate 10 is diced as described in FIG. 2. The protective layer 20 is also illustrated. The wafer is next attached to a wafer frame 50 with an adhesive layer 40 as illustrated in FIG. 17. The frame 50 and the adhesive layer 40 are described above with respect to FIG. 6. The substrate 10 is thinning, for example, by grinding. The resulting structure illustrated in FIG. 18 is similar to that illustrated in FIG. 6. Subsequent processing follows as described using FIGS. 7-11.

Figure 19:
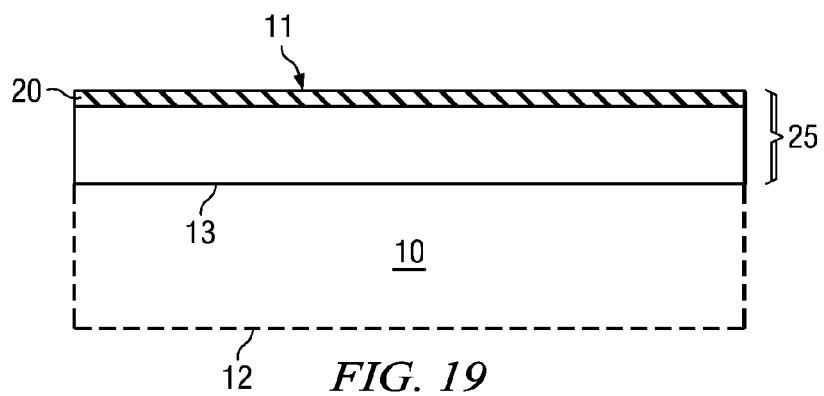
FIGS. 19-21 illustrate an alternative embodiment of the manufacturing of a semiconductor device.
Figure 20:
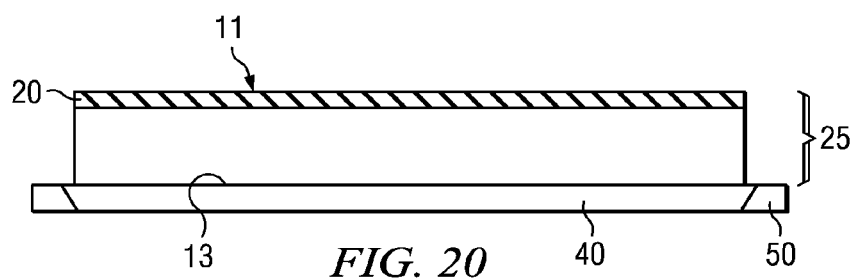
Figure 21:
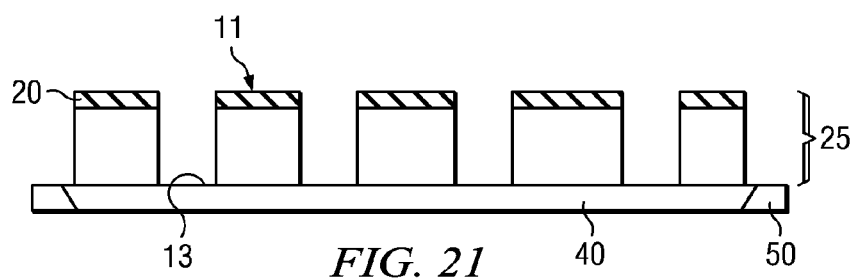

FIGS. 19-21 illustrate an alternative embodiment of the manufacturing of a semiconductor device.

Device regions and interconnect circuitry are formed on a substrate 10 (e.g., wafer) as in conventional processing. The wafer is tested to identify good and/or defective dies. Next, referring to FIG. 19, a substrate 10 having a top surface 11 and a bottom surface 12 is thinned to form a thinned substrate 25 having the top surface 11 and a lower surface 13. The protective layer 20 is also illustrated. The thinned substrate 25 is attached to a wafer frame 50 with an adhesive layer 40 as illustrated in FIG. 20. The frame 50 and the adhesive layer 40 are described above with respect to FIG. 6. Next, the thinned substrate 25 is diced as illustrated in FIG. 21. The resulting structure is similar to that illustrated in FIG. 6. Subsequent processing follows as described using FIGS. 7-11.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing semiconductor devices, the method comprising:
arranging a plurality of semiconductor devices on a frame with an adhesive foil, the plurality of semiconductor devices being attached to the adhesive foil; and
removing the plurality of semiconductor devices from the frame with the adhesive foil using a carbon dioxide snow jet, wherein the removing of the plurality of semiconductor devices from the frame comprises exposing a first side of the plurality of semiconductor devices to the carbon dioxide snow jet, wherein the first side is opposite a second side facing the adhesive foil.

2. The method of claim 1, wherein the plurality of semiconductor devices comprises a plurality of plastic packages.

3. The method of claim 1, wherein the carbon dioxide snow jet is generated using a supersonic nozzle.

4. The method of claim 1, wherein the carbon dioxide snow jet comprises an inner jet and an outer jet surrounding the inner jet.

5. The method of claim 4, wherein the outer jet comprises purified compressed air or nitrogen, and wherein the inner jet comprises carbon dioxide snow and gas.

6. The method of claim 1, wherein removing the plurality of semiconductor devices comprises using the carbon dioxide snow jet to remove an adhesive disposed under the plurality of semiconductor devices.

7. The method of claim 1, wherein the plurality of semiconductor devices comprises a plurality of dies, the method further comprising:
providing a wafer comprising the plurality of dies; and
singulating the wafer into the plurality of dies, wherein arranging a plurality of semiconductor devices on a frame with an adhesive foil comprises attaching the frame with the adhesive foil for carrying the plurality of dies, and wherein removing the plurality of semiconductor devices comprises removing the plurality of dies.

8. The method of claim 7, wherein the wafer has a diameter of about 4" to about 12", and wherein the plurality of dies is removed in about 1 minutes to about 20 minutes from the frame with the adhesive foil.

9. The method of claim 7, wherein singulating the wafer comprises placing the wafer on a carrier, thinning the wafer, and dicing the wafer, and wherein the frame with the adhesive foil is attached with the plurality of dies.

10. The method of claim 7, wherein singulating the wafer comprises thinning the plurality of dies after dicing the wafer.

11. The method of claim 7, further comprising:
identifying first dies of the plurality of dies to be separated from remaining dies of the plurality of dies; and
before removing the plurality of dies, detaching the first dies from the frame with the adhesive foil using a laser process without removing the remaining dies of the plurality of dies.

12. The method of claim 11, wherein detaching the first dies comprises sequentially removing each of the first dies one at a time.

13. The method of claim 12, wherein the laser process uses a focused laser beam having a beam diameter of about 1 μm to about 50 μm.

14. The method of claim 11, wherein detaching the first dies comprises simultaneously removing more than one die of the first dies using the laser process.

15. The method of claim 14, wherein the laser process uses a flat top hybrid laser beam having a beam diameter of about 0.5 mm to about 10 mm.

16. The method of claim 7, further comprising:
after removing the plurality of dies, transferring the plurality of dies to a bowlfeeder handler; and
attaching the plurality of dies into a carrier tape.

17. The method of claim 7, wherein the wafer comprises a semiconductor wafer, wherein providing the wafer comprises fabricating a plurality of discrete devices in the wafer, and wherein each die of the plurality of dies comprises a discrete semiconductor device.

18. The method of claim 1, wherein the carbon dioxide snow jet comprises snow flakes and ice particles.

19. A method of manufacturing a semiconductor device, the method comprising:
providing a wafer comprising a plurality of dies;
testing the plurality of dies to identify first dies of the plurality of dies, the first dies being identified to be separated from remaining dies of the plurality of dies;
singulating the wafer into the plurality of dies;
attaching a frame with an adhesive foil for carrying the plurality of dies; and
using a laser process, detaching the first dies from the frame with the adhesive foil without removing the remaining dies of the plurality of dies.

20. The method of claim 19, wherein detaching the first dies comprises sequentially removing each of the first dies one at a time.

21. The method of claim 19, wherein the laser process uses a focused laser beam having a beam diameter of about 1 μm to about 50 μm.

22. The method of claim 19, wherein the laser process uses a focused laser beam having a beam diameter of about 10 μm to about 300 μm.

23. The method of claim 19, wherein a laser beam of the laser process is moved at a velocity of 10 mm/s to about 500 mm/s relative to the frame with the adhesive foil.

24. The method of claim 19, wherein detaching the first dies comprises simultaneously removing more than one die of the first dies using the laser process.

25. The method of claim 19, wherein the laser process uses a flat top hybrid laser beam.

26. The method of claim 25, wherein the flat top hybrid laser beam has a beam diameter of about 0.5 mm to about 10 mm.

27. The method of claim 19, further comprising removing the remaining dies using a snow jet process comprising snow flakes and ice particles.

28. The method of claim 27, wherein sides of the remaining dies facing away from the frame with an adhesive foil have at least one surface that is exposed to the snow jet process.

29. A method of manufacturing a semiconductor device, the method comprising:
providing a semiconductor wafer comprising a plurality of dies;
identifying defective dies from the plurality of dies;
singulating the semiconductor wafer into the plurality of dies;
attaching a frame with an adhesive foil by a relamination process, the frame with the adhesive foil holding the plurality of dies;
removing the defective dies from the frame with the adhesive foil, using a laser process, without removing remaining dies of the plurality of dies; and
after removing the defective dies, using a carbon dioxide snow jet, removing the remaining dies of the plurality of dies from the frame with the adhesive foil.

30. The method of claim 29, wherein the laser process uses a focused laser beam having a beam diameter of about 1 μm to about 50 μm.

31. The method of claim 29, wherein the remaining dies of the plurality of dies are removed in about 1 minutes to about 20 minutes from the frame with the adhesive foil.

32. The method of claim 29, further comprising:
transferring the remaining dies to a bowlfeeder handler; and
arranging the remaining dies on a tap.

* * * * *